US 9,095,047 B2

(12) United States Patent
Watanabe

(10) Patent No.: US 9,095,047 B2
(45) Date of Patent: Jul. 28, 2015

(54) DISPLAY APPARATUS

(71) Applicant: Shoichi Watanabe, Iwaki (JP)

(72) Inventor: Shoichi Watanabe, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 299 days.

(21) Appl. No.: 13/791,349

(22) Filed: Mar. 8, 2013

(65) Prior Publication Data

US 2013/0308252 A1   Nov. 21, 2013

(30) Foreign Application Priority Data

May 18, 2012   (JP) .................................. 2012-114028

(51) Int. Cl.
*H05K 5/00* (2006.01)
*H05K 7/00* (2006.01)
*H05K 7/20* (2006.01)

(52) U.S. Cl.
CPC .......... *H05K 5/0017* (2013.01); *H05K 7/20963* (2013.01)

(58) Field of Classification Search
CPC ......... G02F 1/16; G06F 1/20; H05K 7/20154; H05K 7/20155
USPC ............. 361/679.01, 679.02, 679.08, 679.09, 361/679.3, 679.55–679.59; 369/282, 291, 369/253, 44.16, 75.5; 455/575.1, 575.3, 455/575.4, 575.8, 575.5
See application file for complete search history.

(56) References Cited

U.S. PATENT DOCUMENTS

2011/0116000 A1\*   5/2011   Dunn et al. ..................... 349/58

FOREIGN PATENT DOCUMENTS

JP        2005-309268        11/2005
JP        2008-089857        4/2008

\* cited by examiner

*Primary Examiner* — Jerry Wu
(74) *Attorney, Agent, or Firm* — Brinks Gilson & Lione

(57) ABSTRACT

In one implementation a display apparatus, a display area of a display screen of a display panel is defined by edge portions of a first window formed in a first frame body. The first frame body is formed from a thin synthetic resin sheet and has upper airflow passages and side airflow passages formed therein. An outer communication portion of each of the upper airflow passages and an outer communication portion of each of the side airflow passages are exposed inside holes formed in a second frame body disposed in front of the first frame body. An inner communication portion of the upper airflow passage and an inner communication portion of the side airflow passage are exposed inside the edge portions of a second window of the second frame body. A space formed between the display panel and a cover plate communicates with the outer space via the upper airflow passages and the side airflow passages.

14 Claims, 8 Drawing Sheets

DISPLAY APPARATUS

RELATED APPLICATIONS

The present application claims priority to Japanese Patent Application Serial Number 2012-114028, filed May 18, 2012, the entirety of which is hereby incorporated by reference.

BACKGROUND OF THE INVENTION

1. Field of the Invention

The present invention relates to a display apparatus having a display panel including, for example, a liquid crystal display device mounted therein. More particularly, the present invention relates to a display apparatus having an improved dustproof function of a space formed between the display panel and a cover plate located in front of the display panel, and an increased ventilation characteristic between the space and the external space.

2. Description of the Related Art

Display apparatuses used for motor vehicles, for example, have a display panel including, for example, a liquid crystal display device held in a metal housing. A cover plate formed from a glass plate or a transparent plastic plate is disposed in front of the display panel. In addition, a touch sensor is mounted on the cover plate as needed.

In order to prevent dirt and dust from entering the interior of the above-described display apparatus, the space formed between the display panel and the cover plate is typically sealed. In addition, in order to prevent dew condensation from forming on the display panel and the cover plate due to the temperature differential between the inside and outside of the space, ventilation is typically provided between the inside and outside of the space.

In a liquid crystal display apparatus described in Japanese Unexamined Patent Application Publication No. 2005-309268, a liquid crystal unit is held in a housing, and a transparent protective panel is fixed to the front portion of the housing. A frame-shaped dustproof sheet is disposed between the housing and the liquid crystal unit. The dustproof sheet is formed of a foam material. The dustproof sheet prevents dirt and dust from entering the space formed between the liquid crystal unit and the protective panel from the outside. At that time, the foam material allows the space formed between the liquid crystal unit and the protective panel to communicate with the exterior space.

In a liquid crystal display apparatus described in Japanese Unexamined Patent Application Publication No. 2008-89857, a protective glass is disposed in front of the liquid crystal unit. A frame-shaped seal member is disposed between the liquid crystal unit and the protective glass.

The seal member is formed of an elastic material, such as urethane, rubber, or sponge. The seal member prevents dirt and dust from the outside from entering the space formed between the liquid crystal unit and the protective glass. In addition, the seal member has a vent that passes therethrough in the thickness direction. The vent allows the space formed between the liquid crystal unit and the protective glass to communicate with the exterior space.

SUMMARY OF THE INVENTION

In the liquid crystal display apparatus described in Japanese Unexamined Patent Application Publication No. 2005-309268, a porous foam member is disposed between the display panel and the protective panel. Those of skill in the art will appreciate that it is often difficult to allow air to sufficiently flow in and out of a space between a display panel and a protective panel through fine pores formed in the porous foam member. In order to allow air to sufficiently flow in and out of the space, a thickness of the foam member may be increased. However, if the thickness of the foam member is increased, the distance between the display panel and the protective panel increases and, thus, the entire thickness of a liquid crystal display apparatus increases.

In the liquid crystal display apparatus described in Japanese Unexamined Patent Application Publication No. 2008-89857, a vent is formed in the seal member that passes through the seal member in the thickness direction. However, it is highly likely that dirt and dust may directly enter the vent from the outside and, therefore, the dustproof performance of the seal member for the space formed between the liquid crystal unit and the protective glass easily decreases.

It is an object of the present invention to provide a display apparatus that has a low-profile structure and that has a high dustproof performance for the space formed between a display panel and a cover plate, while allowing air to sufficiently flow in and out of the space.

In one implementation of the present invention, a display apparatus includes a display panel, a first frame body disposed in front of the display panel, a second frame body disposed in front of the first frame body, and a translucent cover plate disposed in front of the second frame body. A first window formed in the first frame body and a second window formed in the second frame body are located in front of a display screen of the display panel. An airflow passage is formed in the first frame body so as to pass through the first frame body. At least part of an outer communication portion of the airflow passage is positioned so as not to occupy the same space as the second frame body. Further, at least one inner communication portion of the airflow passage communicates with a space formed between the display panel and the cover plate.

The airflow passage can be formed in the first frame body that is positioned in the apparatus between the display panel and the second frame body. The airflow passage formed in the first frame body can extend in a plane parallel to the display screen. Accordingly, even when the first frame body has a thin structure, the space formed between the display panel and the cover plate can be made to communicate with the outer space via the airflow passages. In addition, by forming the airflow passages in the thin first frame body, entry of dirt and dust into the space formed between the display panel and the cover plate can be easily prevented.

The display panel can have a metal case frame body attached thereto, the case frame body can have a display window that allows a display screen to be exposed therethrough, and an edge portion of the first window can be located closer to the center of the display screen than an edge portion of the display window. In such a structure, an edge portion of the first window defines a range of the display screen of the display panel. Accordingly, the first frame body can have both a function of controlling the shape of the display screen and a function of controlling the airflow using the airflow passage.

It is desirable that the first frame body be formed from a colored synthetic resin sheet. Since the thickness of the first frame body formed from a synthetic resin sheet can be reduced, the display apparatus can be easily made low profile.

An edge portion of the first window can be located closer to the center of the display screen than an edge portion of the second window. In such a structure, it is desirable that the inner communication portion be formed at a position away from an edge portion of the first window.

According to the structure, the inner communication portion does not appear in the edge portions of the first window that defines the shape and the size of the display screen of the display panel. Thus, the airflow passage can be invisible in the field of view when the display screen is viewed.

The second frame body can have one of a hole and a notch formed therein, the one of the hole and the notch allows the outer communication portion of the airflow passage to be exposed thereinside, and the airflow passage can communicate with a space immediately in front of the second frame body.

According to the above-described structure, since the space formed between the display panel and the cover plate can be made to communicate with a large outer space immediately in front of the second frame body, the temperature difference between the space and the outer space can be easily prevented.

The inner communication portion can be formed so as to protrude from an edge portion of the second window. In this case, it is desirable that the edge portion of the second window has a concave portion that allows the inner communication portion to be exposed thereinside.

According to the above-described structure, the inner communication portion formed between the display panel and the second frame body can be reliably made to communicate with the space formed between the display panel and the cover plate.

It is desirable that the airflow passage have a bent portion between the outer communication portion and the inner communication portion. By providing the bent portion, even when dirt and dust enter the outer communication portion, it is difficult for the dirt and dust to reach the space formed between the display panel and the cover plate through the inner communication portion.

The airflow passage can have an intermediate communication portion between the outer communication portion and the inner communication portion. A bent portion can be formed in a first boundary portion formed between the outer communication portion and the intermediate communication portion, and a bent portion can be formed in a second boundary portion formed between the inner communication portion and the intermediate communication portion. In this case, it is desirable that the second boundary portion be disposed farther from the display screen than the first boundary portion.

In addition, a bent portion can be formed in the middle of the intermediate communication portion.

The airflow passage can have the outer communication portion and a plurality of the inner communication portions. In such a case, the airflow passage can have a bent portion in a boundary portion between the outer communication portion and the inner communication portion.

An exterior panel can be disposed in front of the cover plate, and an edge portion of a panel window formed in the exterior panel can be located closer to the center of the display screen than an edge portion of the first window.

According to the above-described structure, when a panel window is viewed from the front at an angle, the first frame body is negligibly visible. Accordingly, the airflow passage is also negligibly visible from the outside.

The cover plate can have a touch sensor mounted thereon.

In an implementation of the present invention, the airflow passage is formed in the first frame body disposed between the display panel and the second frame body. The airflow passage extends in a plane parallel to the display screen. Therefore, even when the first frame body is formed from a thin material, the space formed between the display panel and the cover plate can be made to communicate with the outer space. As a result, the temperature difference between the space and the outer space can be reduced and, thus, dew formation on the display panel and the cover plate can be easily prevented. In addition, by forming the airflow passage in the thin first frame body formed from, for example, a resin sheet, it is difficult for dirt and dust to enter the space. Furthermore, the display apparatus can be made low profile.

DETAILED DESCRIPTION OF THE DRAWINGS

Figure 1:
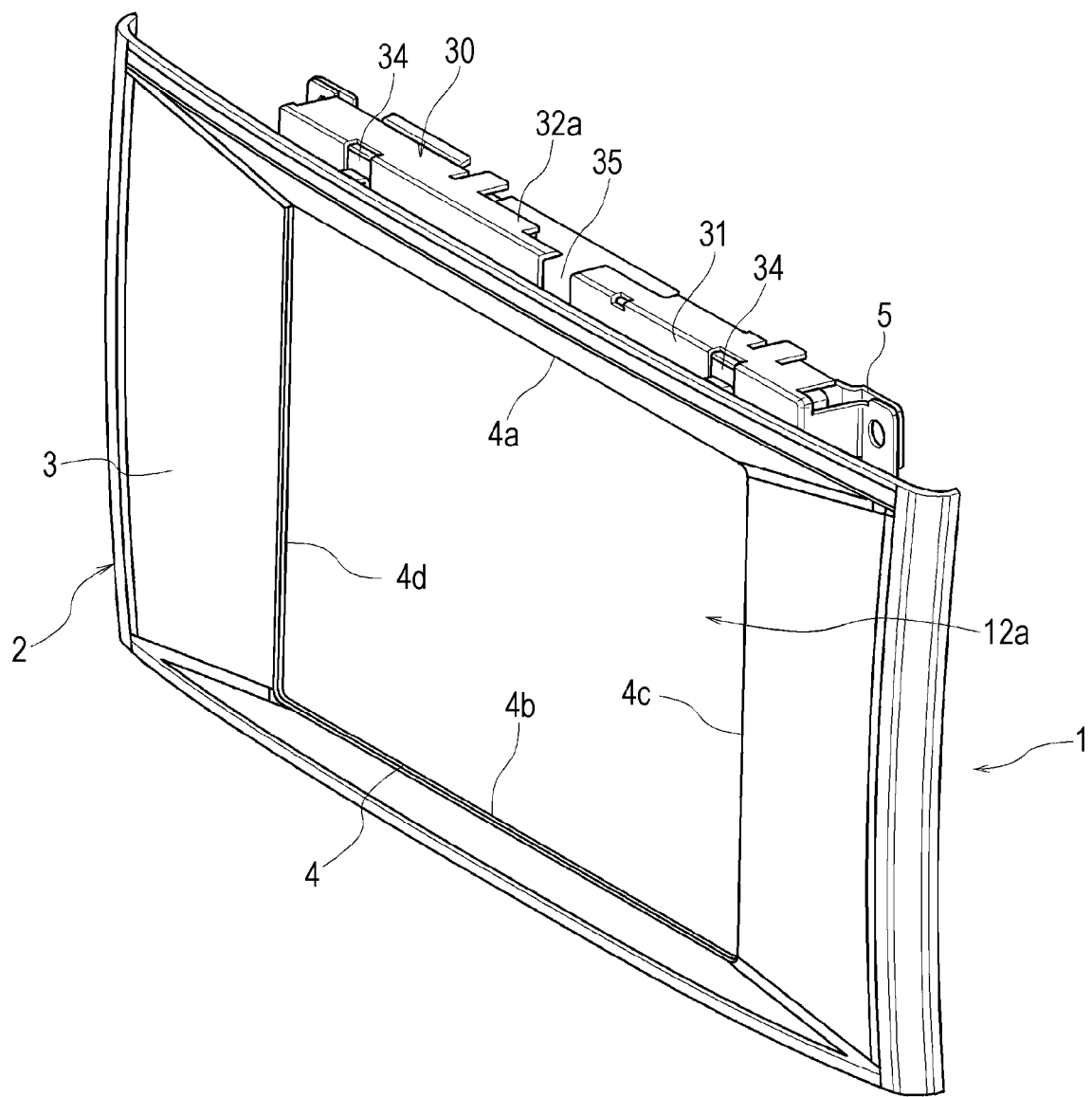
FIG. 1 is a perspective view of a vehicle display apparatus viewed from the front according to an embodiment of the present invention.
Figure 2:
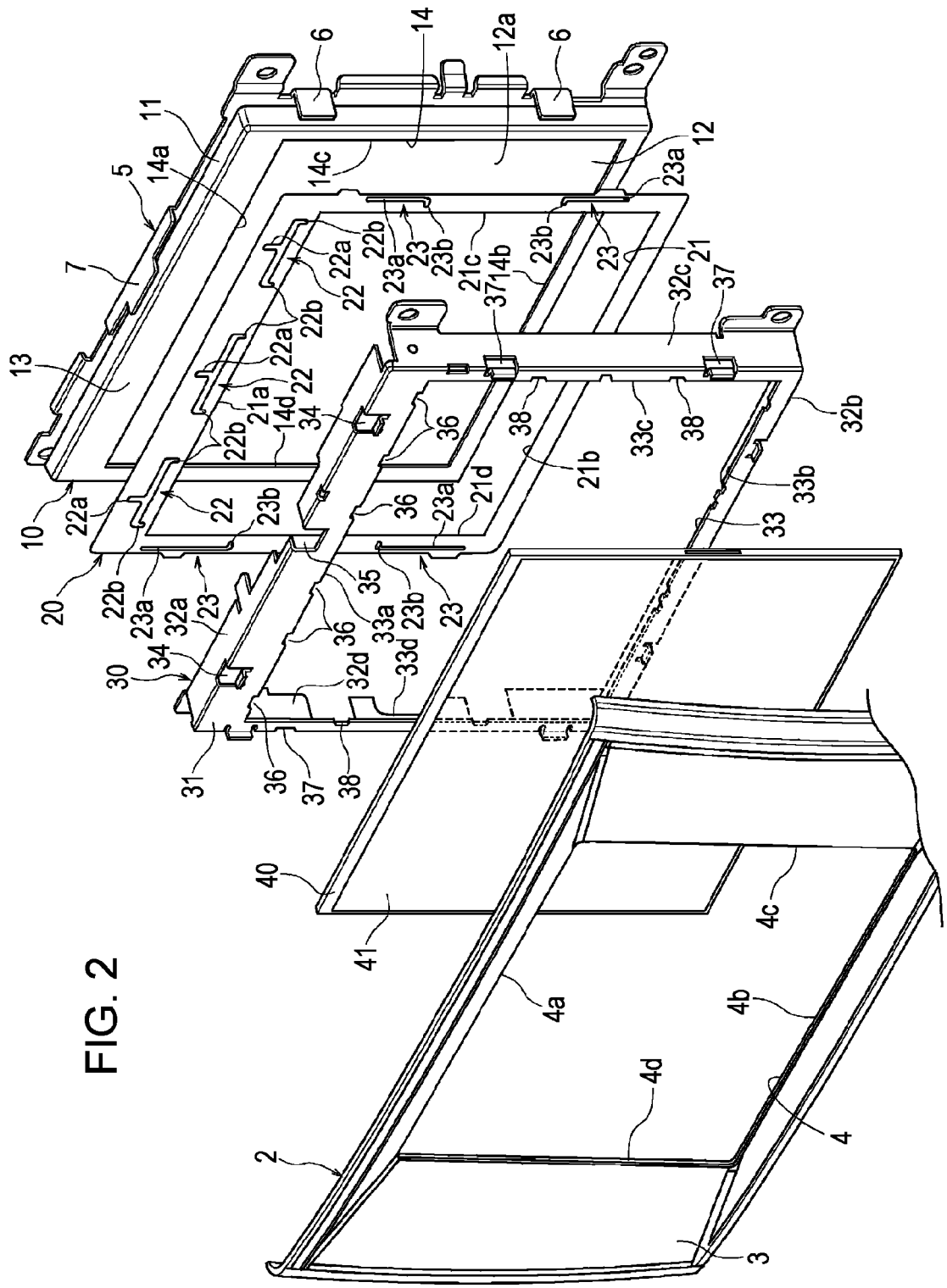
FIG. 2 is an exploded perspective view of the vehicle display apparatus illustrated in FIG. 1.

As illustrated in FIGS. 1 and 2, a vehicle display apparatus 1 may include an exterior panel 2. The exterior panel 2 is formed of a synthetic resin material and has a front surface 3 serving as a decorative sheet. The vehicle display apparatus 1 may be integrated into an instrumental panel or a dashboard in the front portion of the compartment of a motor vehicle. The front surface 3 of the exterior panel 2 is substantially coplanar with the surface of the instrument panel or dashboard.

Alternatively, the vehicle display apparatus 1 may be stored in a box-shaped exterior housing, and the housing may be disposed on the near side of the windshield. In such a case, the front panel of the exterior housing is used as the exterior panel 2.

As illustrated in FIGS. 1 and 2, a panel window 4 is formed in the exterior panel 2 so as to pass through the exterior panel 2 in the front-rear direction.

As illustrated in FIG. 2, a support housing 5 is disposed inside the exterior panel 2. The support housing 5 may be formed by bending a metal plate. Each of a plurality of retaining pieces 6 and 7 of the support housing 5 is bent forward. Thus, a display panel 10 disposed in front of the support housing 5 is retained in place by the retaining pieces 6 and 7.

As illustrated in FIG. 2 and FIGS. 4 to 7, the display panel 10 includes a display case 11 formed by bending a metal plate. A liquid crystal display device 12 is retained in the display case 11. A circuit board having a variety of electronic components mounted thereon is disposed on the back of the liquid crystal display device 12. The electronic components form, for example, a liquid crystal drive circuit and a power supply circuit. Note that a display device other than the liquid crystal display device 12 (e.g., a display device including an electrochromic element) may be employed as the display panel 10.

A case frame body 13 that surrounds the display panel 10 may be disposed in front of the display case 11 in an integrated manner. A display window 14 is formed in the case frame body 13. A display screen 12a of the liquid crystal display device 12 is exposed through the display window 14.

A first frame body 20 is disposed in front of the display panel 10. As indicated by the cross-sectional views of FIGS. 4 to 7, the first frame body 20 is disposed on the front surface of the case frame body 13 of the display case 11 so as to be in tight contact with the front surface. The first frame body 20 may be formed by cutting a synthetic resin sheet. It is desirable that the synthetic resin sheet be greater than or equal to 0.1 mm and less than or equal to 0.5 mm in thickness, and it is more desirable that the synthetic resin sheet be greater than or equal to 0.1 mm and less than or equal to 0.35 mm in thickness. In one implementation, a synthetic resin sheet having a thickness of 0.25 mm is employed.

The front surface and the interior surface of the synthetic resin sheet that forms the first frame body 20 may be uniformly colored. The hue of the color may be other than white and a metal color. Examples of the color include black, gray, green, and blue. It is desirable that the color be an achromatic color other than white, such as black or gray.

Figure 4:
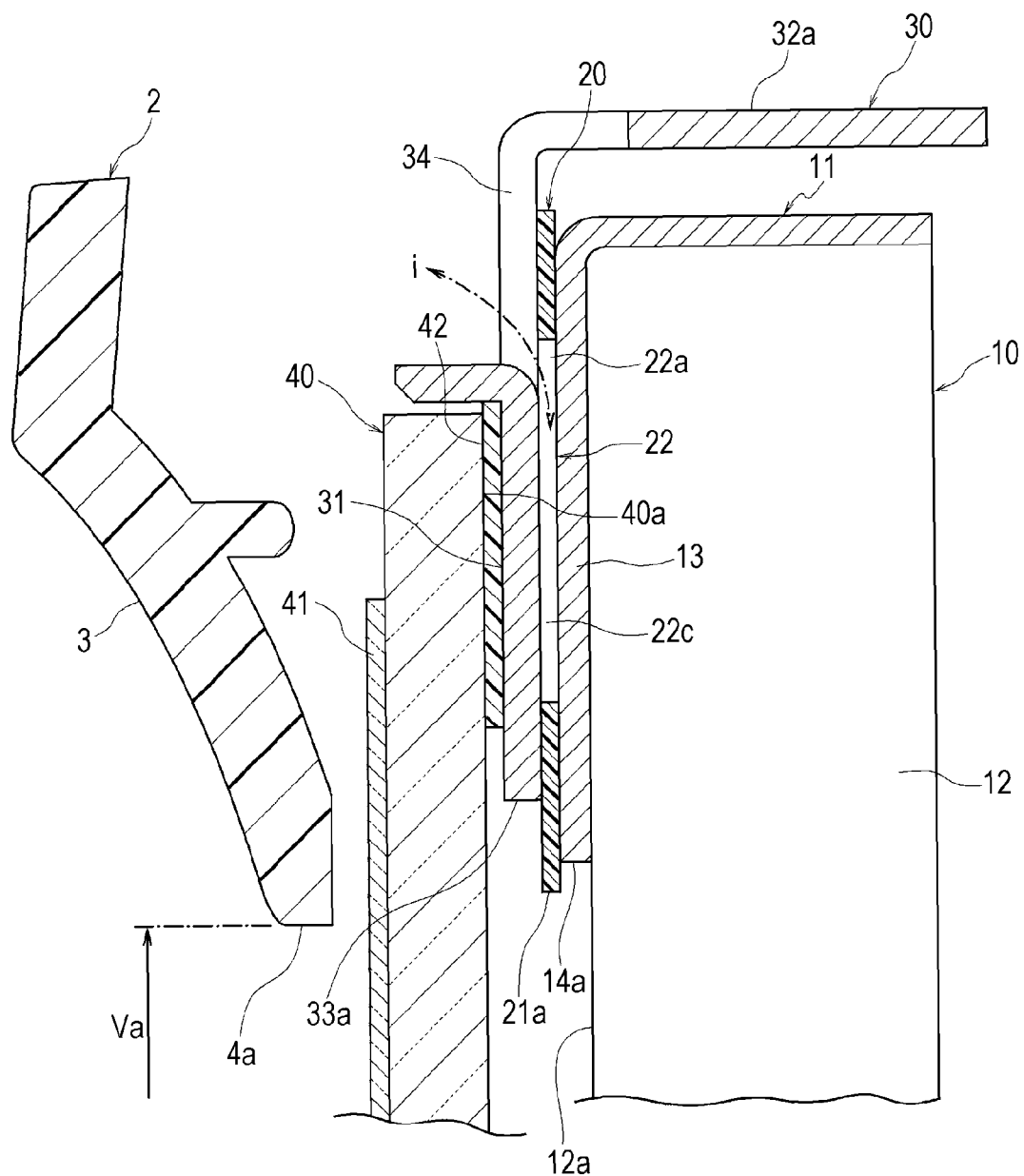
FIG. 4 is a cross-sectional view taken along a line IV-IV of FIG. 3.
Figure 5:
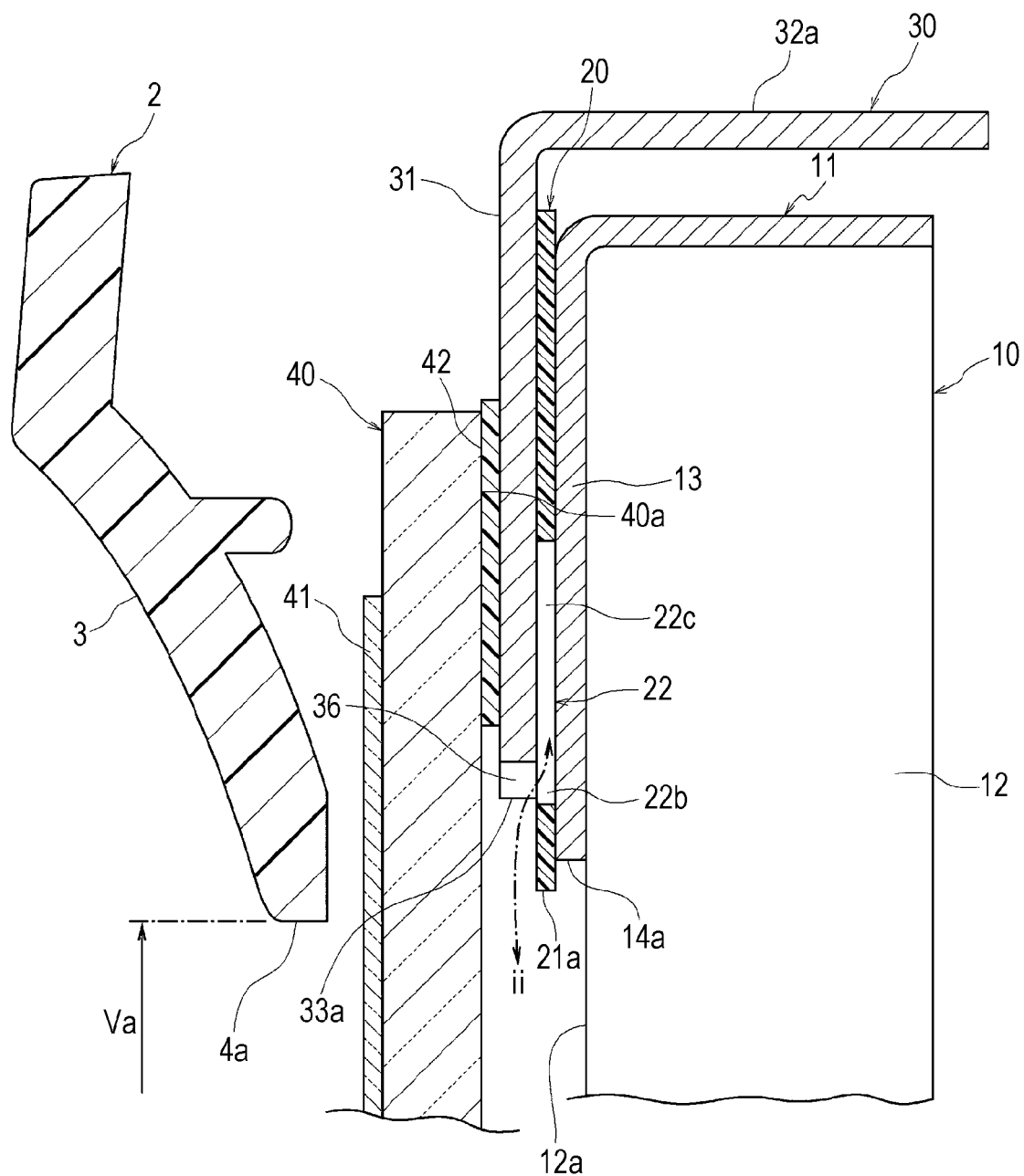
FIG. 5 is a cross-sectional view taken along a line V-V of FIG. 3.
Figure 6:
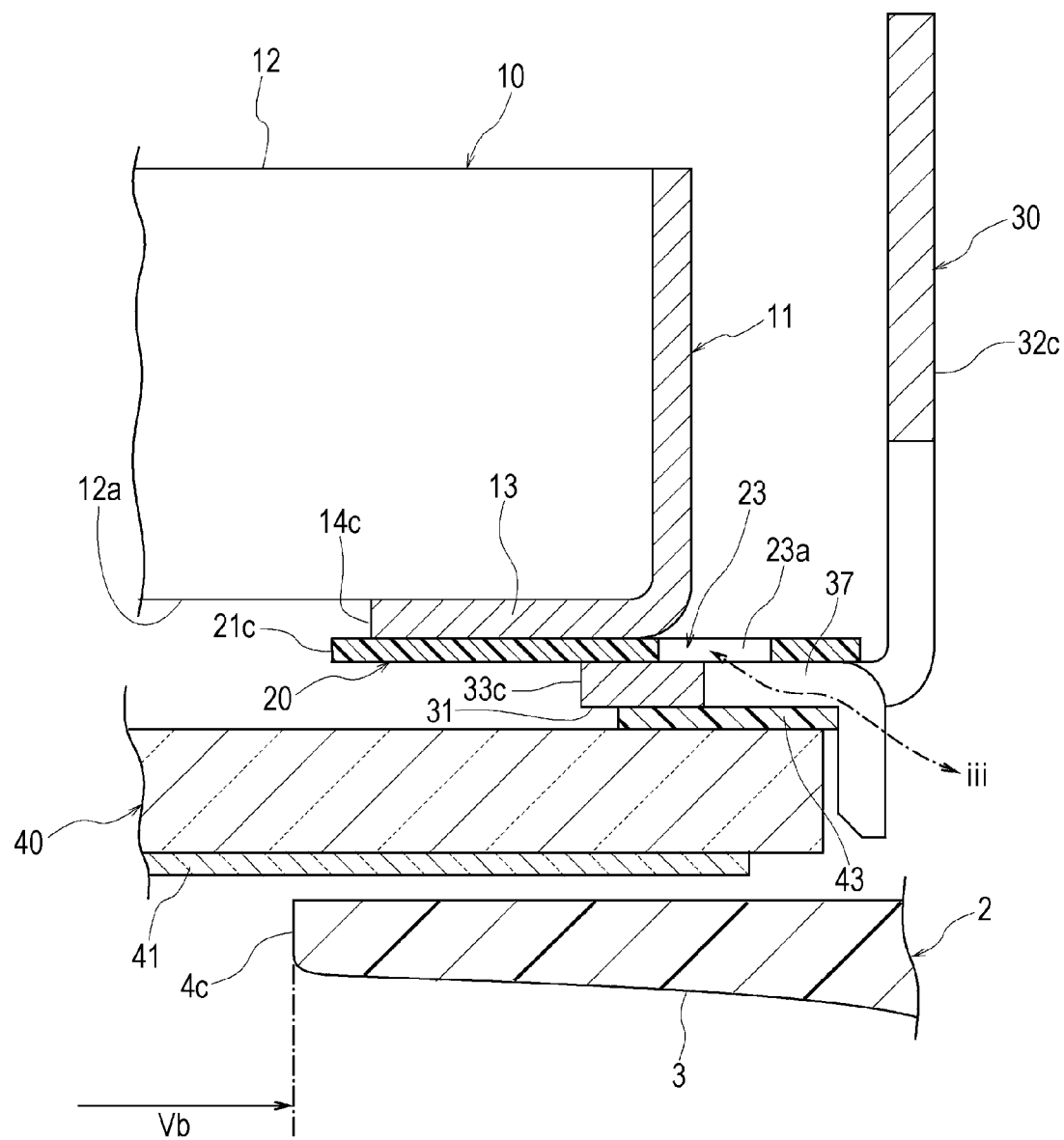
FIG. 6 is a cross-sectional view taken along a line VI-VI of FIG. 3.
Figure 7:
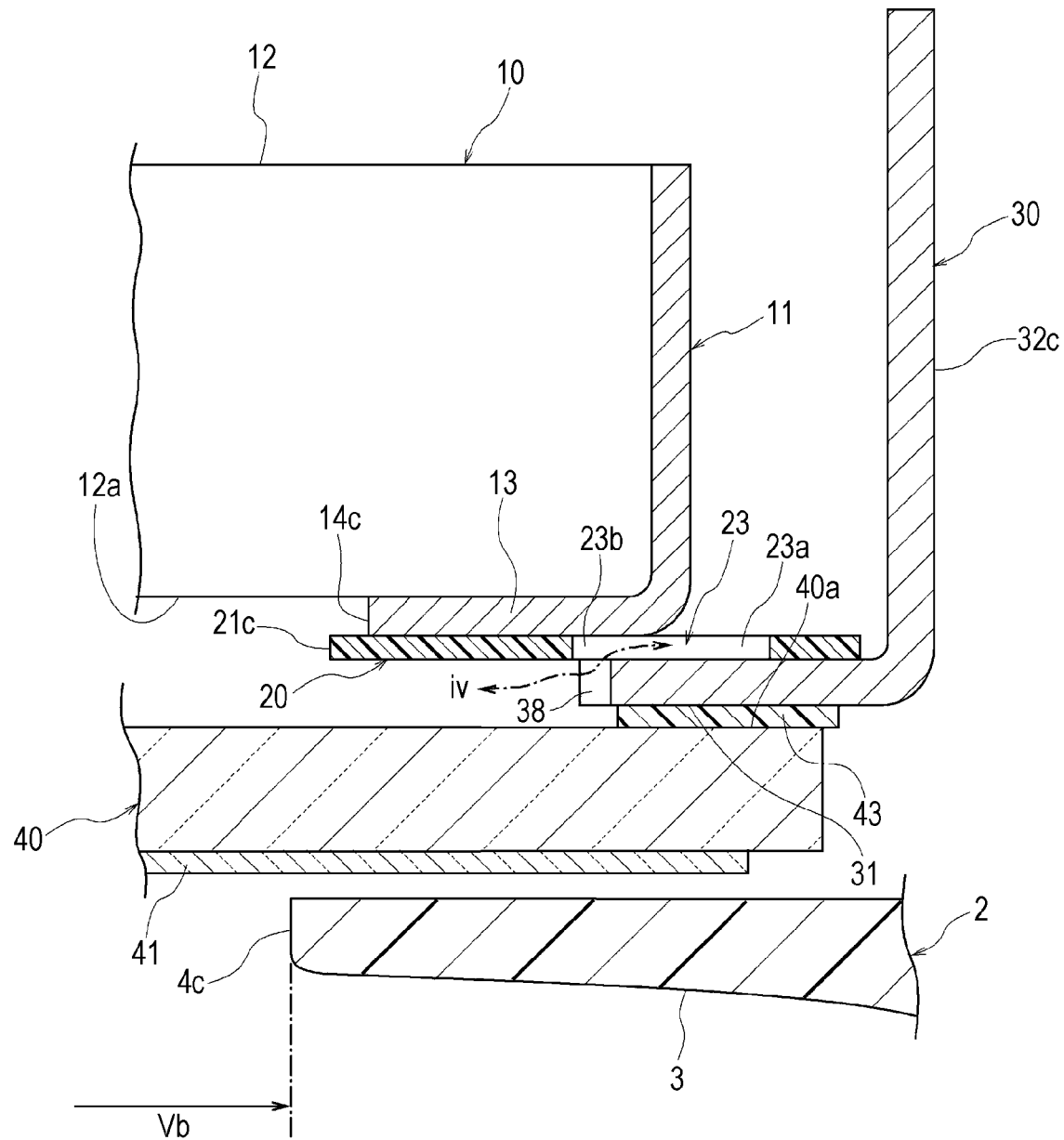
FIG. 7 is a cross-sectional view taken along a line VII-VII of FIG. 3.

A first window 21 is formed in the first frame body 20. The first window 21 is rectangular. As illustrated in FIGS. 4 and 5, an upper edge portion 21a of the first window 21 is closer to the center of the display screen 12a than an upper edge portion 14a of the display window 14 formed in the case frame body 13. Similarly, a lower edge portion 21b of the first window 21 is closer to the center of the display screen 12a than a lower edge portion 14b of the display window 14. As illustrated in FIGS. 6 and 7, a right edge portion 21c of the first window 21 is closer to the center of the display screen 12a than a right edge portion 14c of the display window 14. Similarly, a left edge portion 21d of the first window 21 is closer to the center of the display screen 12a than a left edge portion 14d of the display window 14.

As illustrated in FIGS. 4 to 7, the edge portions 21a, 21b, 21c, and 21d of the first window 21 protrude closer toward the center of the display screen 12a than the edge portions 14a, 14b, 14c, and 14d of the display window 14, respectively. Accordingly, the display area (the display range) of the display screen 12a of the display panel 10 may actually be determined by the edge portions 21a, 21b, 21c, and 21d of the first window 21.

The case frame body 13 is formed from a plated metal plate. However, since the display window 14 is formed by a punching process, the metal color of the metal plate directly appears in the edge portions 14a, 14b, 14c, and 14d. Note that since the edge portions 21a, 21b, 21c, and 21d of the first window 21 protrude closer toward the center of the display screen 12a than the edge portions 14a, 14b, 14c, and 14d of the display window 14, respectively, the edge portions 14a, 14b, 14c, and 14d of the display window 14 are hidden by the first frame body 20 formed of a colored synthetic resin even when the display screen 12a is viewed from the front at an angle. Thus, the edge portions 14a, 14b, 14c, and 14d are prevented from being viewed.

In contrast, although the first window 21 is also formed by a punching process, the hue of the color of the colored synthetic resin sheet directly appears on the edge portions 21a, 21b, 21c, and 21d of the first window 21 since the first frame body 20 is formed from the colored synthetic resin sheet. Accordingly, even when the edge portions 21a, 21b, 21c, and 21d are viewed, the edge portions are recognized as a mask that limits the display range of the display screen 12a and, therefore, the display quality is not degraded by the presence of the edge portions 21a, 21b, 21c, and 21d.

As illustrated in FIG. 2, three upper airflow passages 22 are formed in the first frame body 20 at positions above the upper edge portion 21a of the first window 21.

Figure 3:
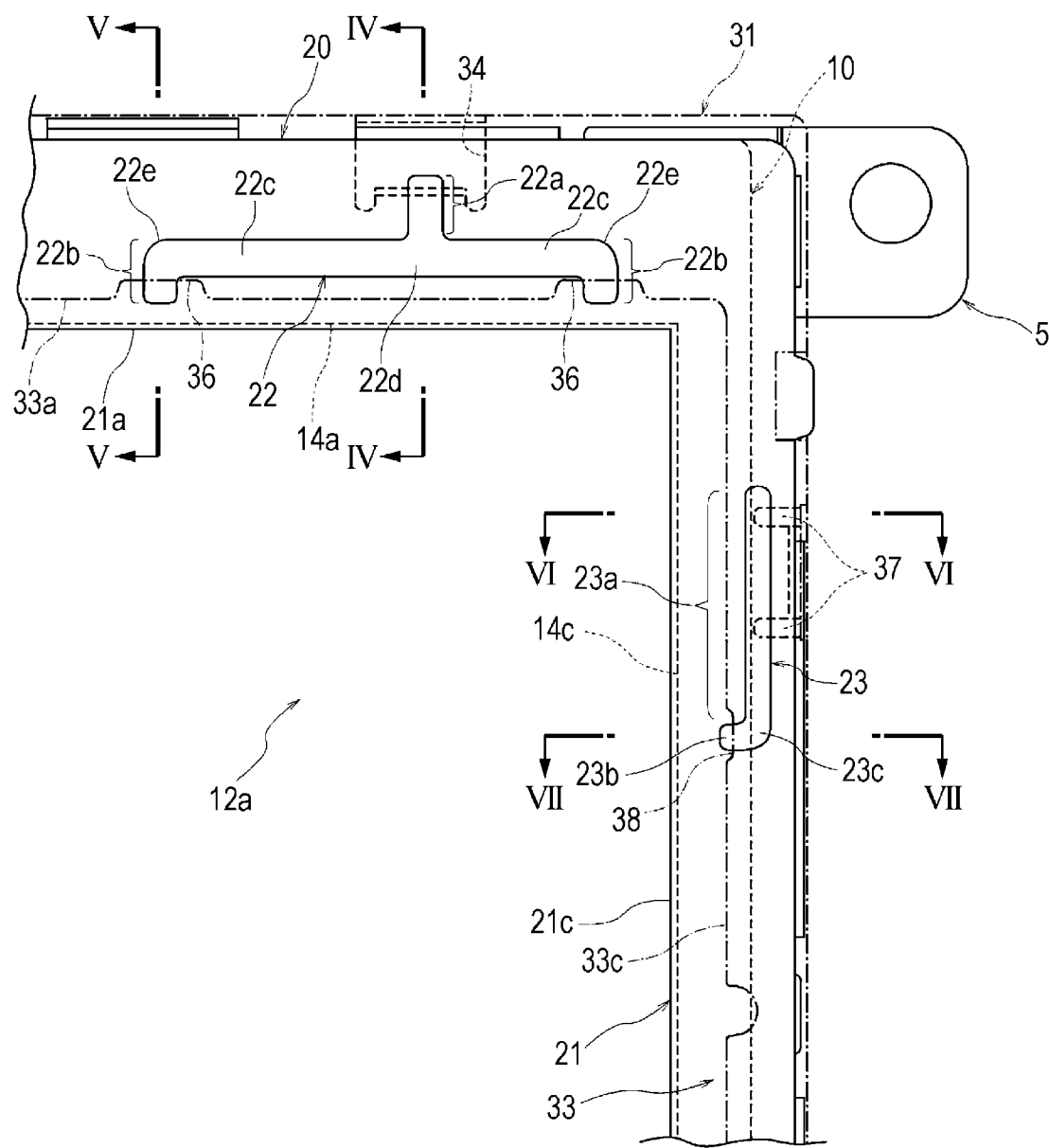
FIG. 3 is a partial front view of the vehicle display apparatus illustrated in FIG. 1 with an exterior panel removed.

As illustrated in FIG. 3, each of the upper airflow passages 22 includes an outer communication portion 22a, two (or more) inner communication portions 22b, and two intermediate communication portions 22c each connecting the outer communication portion 22a to one of the two inner communication portions 22b. The outer communication portion 22a is perpendicular to each of the two intermediate communication portions 22c in a T shape. A first boundary portion 22d between the outer communication portion 22a and each of the two intermediate communication portions 22c is a bent portion that is bent at a right angle. Each of the two inner communication portions 22b is perpendicular to the corresponding one of the two intermediate communication portions 22c in an L shape. Each of second boundary portions 22e between the inner communication portion 22b and the intermediate communication portion 22c is a bent portion that is bent at a right angle.

As illustrated in FIG. 2, the first frame body 20 has two side airflow passages 23 on the right of the right edge portion 21c of the first window 21 and two side airflow passages 23 on the left of the left edge portion 21d.

As illustrated in FIG. 3, each of the two side airflow passages 23 has an outer communication portion 23a that extends linearly in the vertical direction and an inner communication portion 23b that extends from an end of the outer communication portion 23a toward the display screen 12a. A boundary portion 23c between the outer communication portion 23a and the inner communication portion 23b is a bent portion that is bent at a substantially right angle.

Three upper airflow passages 22 and a total of four side airflow passages 23 are formed by a punching process so as to pass completely through part of the first frame body 20 in the thickness direction. The first frame body 20 is formed from a colored synthetic resin sheet. Accordingly, the edge portions of the three upper airflow passages 22 and the edge portions of the four side airflow passages 23 have a hue that is the same as the hue of the entire first frame body 20. Thus, the edge portions do not excessively reflect light.

As illustrated in FIG. 3, the lower ends of the two inner communication portions 22b provided in each of the three upper airflow passages 22 are located above and away from the upper edge portion 21a of the first window 21. The left end of the inner communication portion 23b provided in the right side airflow passage 23 is located to the right of and away from the right edge portion 21c of the first window 21. Similarly, the right end of the inner communication portion 23b provided in the left side airflow passage 23 is located to the left of, and away from, the left edge portion 21d of the first window 21.

Each of the two inner communication portions 22b of the three upper airflow passages 22 and the inner communication portion 23b of the two side airflow passages 23 do not continuously extend to the edge portion 21a, 21c, or 21d of the first window 21. That is, each of the two inner communication portions 22b of the three upper airflow passages 22 and the inner communication portion 23b of the two side airflow passages 23 is formed at a position away from the edge portion 21a, 21c, or 21d. Accordingly, each of the edge portions 21a, 21c, and 21d is viewed as a straight line. When viewed from the front, the display area of the display screen 12a is surrounded by the linear edge portions 21a, 21b, 21c, and 21d of the first window 21 and, therefore, the rectangular display area can be clearly recognized.

As illustrated in FIG. 2, a front housing 30 is disposed in front of the first frame body 20. The front housing 30 is formed from a metal plate having a plated surface through a punching process and a bending process. The front housing 30 has a second frame body 31 facing forward, an upper flange 32a which is bent at a right angle from the upper edge of the second frame body 31 backward, a lower flange 32b which is bent at a right angle from the lower edge of the second frame body 31 backward, and left and right side flanges 32c and 32d which are bent at a right angle from the left and right edges of the second frame body 31 backward.

The support housing 5 is connected to the front housing 30 using, for example, a fixing screw. In this manner, a metal housing is formed. The display panel 10 and the first frame body 20 are stored in the housing. As illustrated in FIGS. 4 to 7, the second frame body 31 of the front housing 30 is in tight contact with the front surface of the first frame body 20. The first frame body 20 is positioned between (sandwiched by) the case frame body 13 of the display panel 10 and the second frame body 31 so as to be in tight contact with the surfaces of the case frame body 13 and the second frame body 31.

A rectangular second window 33 is formed in the second frame body 31 provided in the front housing 30 by a punching process. As illustrated in FIGS. 4 and 5, an upper edge portion 33a of the second window 33 is disposed above and away from the upper edge portion 21a of the first window 21 formed in the first frame body 20, that is, is disposed at a position away from the display screen 12a. Similarly, a lower edge portion 33b of the second window 33 is disposed below and away from the lower edge portion 21b of the first window 21, that is, is disposed at a position away from the display screen 12a.

As illustrated in FIGS. 6 and 7, a right edge portion 33c of the second window 33 is located to the right of, and away from, the right edge portion 21c of the first window 21, that is, is located at a position away from the display screen 12a. Similarly, a left edge portion 33d of the second window 33 is located to the left of and away from the left edge portion 21d of the first window 21, that is, is located at a position away from the display screen 12a.

The edge portions 33a, 33b, 33c, and 33d of the second window 33 formed in the second frame body 31 are located farther from the display screen 12a than the edge portions 21a, 21b, 21c, and 21d of the first window 21 of the first frame body 20. Accordingly, the display area of the display screen 12a of the display panel 10 is defined by the edge portions 21a, 21b, 21c, and 21d of the first window 21. Thus, the edge portions 33a, 33b, 33c, and 33d of the second window 33 are negligibly visible from the front.

As illustrated in FIG. 2, the second frame body 31 has two holes 34 and a notch 35 formed therein above the second window 33. As illustrated in FIG. 3, an upper end portion of the outer communication portion 22a of one of the upper airflow passages 22 formed on the right side of the first frame body 20 is located inside one of the holes 34 formed on the right side of the second frame body 31. Thus, the upper end portion of the outer communication portion 22a and the second frame body 31 do not occupy the same space.

Similarly, the outer communication portion 22a of one of the upper airflow passages 22 formed on the left side of the first frame body 20 is exposed inside the other of the two holes 34 that is open on the left side of the second frame body 31. In addition, the outer communication portion 22a of one of the upper airflow passages 22 located in the middle of the first frame body 20 is exposed inside the notch 35 that is open in the middle of the second frame body 31.

As a result, as indicated by "i" illustrated in FIG. 4, the upper end portions of all of the outer communication portions 22a can communicate with a space immediately in front of the second frame body 31 via the inside of the two holes 34 and the inside of the notch 35.

As illustrated in FIG. 2, a plurality of concave portions 36 that are concaved upward are formed in the upper edge portion 33a of the second window 33. As illustrated in FIG. 3, each of the two inner communication portions 22b of the upper airflow passage 22 formed on the right side of the first frame body 20 is located inside one of the concave portions 36. Thus, the lower end portion of the inner communication portion 22b and the second frame body 31 do not occupy the same space. Similarly, the lower end portions of the inner communication portions 22b of the two upper airflow passages 22 located on the left side of the first frame body 20 and in the middle of the first frame body 20 are exposed inside the concave portions 36.

As a result, as indicated by "ii" illustrated in FIG. 5, the lower end portions of all of the inner communication portions 22b can communicate with a space immediately in front of the display panel 10 via the concave portions 36.

As illustrated in FIG. 2, each of the right edge portion and the left edge portion of the second frame body 31 has two holes 37 (or notches) formed therein. As illustrated in FIG. 3, part of the outer communication portion 23a of the side airflow passage 23 is formed so as to overlap the two holes 37. That is, part of the outer communication portion 23a is positioned so as not to occupy the same space as the second frame body 31. The same applies to the other side airflow passages 23 (other than the side airflow passage 23 illustrated in FIG. 3).

As a result, as indicated by "iii" illustrated in FIG. 6, the outer communication portions 23a of all of the side airflow passages 23 can communicate with a space immediately in front of the second frame body 31 via the holes 37.

As illustrated in FIGS. 2 and 3, two concave portions 38 are formed in each of the right edge portion 33c and the left edge portion 33d of the second window 33 of the second frame body 31. As illustrated in FIG. 3, the top end of the inner communication portion 23b of the side airflow passage 23 extends to a position at which the top end overlaps one of the concave portions 38. Similarly, the inner communication portions 23b of the side airflow passages 23 other than the side airflow passage 23 illustrated in FIG. 3 are exposed inside the concave portions 38.

As a result, as indicated by "iv" illustrated in FIG. 7, the inner communication portions 23b of all of the side airflow passages 23 can communicate with a space immediately in front of the display panel 10 via the concave portions 38.

As illustrated in FIG. 2, a cover plate 40 is disposed in front of the second frame body 31 provided in the front housing 30. The cover plate 40 is formed as a glass plate or a transparent synthetic resin sheet. The cover plate 40 has a touch sensor 41 disposed on the front surface thereof. The touch sensor 41 is of a resistance detection type or a capacitance detection type.

The touch sensor 41 of a resistance detection type includes a first transparent electrode layer, such as an indium tin oxide (ITO) layer, on top of the cover plate 40 or a transparent substrate disposed on top of the surface of the cover plate 40. The touch sensor 41 further includes a second transparent electrode layer formed on the inner surface of a flexible transparent sheet disposed in front of the first transparent electrode layer. When the flexible transparent sheet is pressed by a finger, the two transparent electrodes are brought into contact with each other. A point at which the two transparent electrodes are brought into contact with each other is computed using the resistance ratio of each of the transparent electrodes.

The touch sensor 41 of a capacitance detection type includes a plurality of first transparent electrode layers, such as ITO layers, on top of the cover plate 40 or a transparent substrate disposed on top of the surface of the cover plate 40. The touch sensor 41 further includes a plurality of second transparent electrode layers on a transparent front substrate formed in front of the first transparent electrode layers. When the front surface of the front substrate is touched by a finger, the value of a capacitance formed between the first transparent electrode layer and the second transparent electrode layer is added to the value of a capacitance formed between the transparent electrode layer and the finger. A point at which the finger touches front substrate is computed using the variation in the capacitance. Note that the cover plate 40 that does not include the touch sensor 41 may be employed.

As illustrated in FIGS. 4 and 5, a thin elastic sheet 42 is bonded and fixed to each of an upper portion and a lower portion of the front surface of the second frame body 31. As illustrated in FIGS. 6 and 7, a thin elastic sheet 43 is bonded and fixed to each of a right portion and a left portion of the front surface of the second frame body 31. A back surface 40a of the cover plate 40 is bonded to each of the front surfaces of the elastic sheet 42 and the elastic sheet 43.

As illustrated in FIGS. 1 and 2, the panel window 4 formed in the exterior panel 2 is rectangular. As illustrated in FIGS. 4 and 5, an upper edge portion 4a of the panel window 4 protrudes further downward than the upper edge portion 21a of the first window 21 formed in the first frame body 20. In addition, a lower edge portion 4b of the panel window 4 protrudes further upward than the lower edge portion 21b of the first window 21. A field of view Va of the display screen 12a in the up-down direction is defined by the distance between the upper edge portion 4a and the lower edge portion 4b.

As illustrated in FIGS. 6 and 7, a right edge portion 4c of the panel window 4 protrudes further leftward than the right edge portion 21c of the first window 21 formed in the first frame body 20. In addition, the left edge portion 4d of the panel window 4 protrudes further rightward than the left edge portion 21d of the first window 21. A field of view Vb of the display screen 12a in the right-left direction is defined by the distance between the right edge portion 4c and the left edge portion 4d.

In the vehicle display apparatus 1, the first frame body 20 formed from a synthetic resin sheet has the three upper airflow passages 22 and the two side airflow passages 23 formed therein. The upper airflow passages 22 and the side airflow passages 23 having predetermined widths extend in a plane parallel to the display screen 12a. Accordingly, even when the thickness of the first frame body 20 is small (i.e., less than or equal to 0.5 mm), the space formed between the display panel 10 and the cover plate 40 can be made to communicate with the outer space via the upper airflow passages 22 and the side airflow passages 23.

Since each of the outer communication portions 22a of the upper airflow passages 22 is formed at a position that overlaps one of the holes 34 formed in the second frame body 31 or the notch 35, the space formed between the display panel 10 and the cover plate 40 can be made to communicate with a large space immediately in front of the second frame body 31 via the upper airflow passages 22 and the holes 34 (or the notch 35), as illustrated in FIG. 4. In addition, since each of the outer communication portions 23a of the side airflow passages 23 faces one of the holes 37 formed in the second frame body 31, the space formed between the display panel 10 and the cover plate 40 can be made to communicate with the large space immediately in front of the second frame body 31 via the side airflow passages 23 and the holes 37, as illustrated in FIG. 6.

Since the space formed between the display panel 10 and the cover plate 40 communicate with the large space immediately in front of the second frame body 31, a temperature difference between the space and the outer space can be decreased. Thus, dew formation on the back surface 40a of the cover plate 40 and the display screen 12a can be easily prevented.

Since the upper airflow passages 22 and the side airflow passages 23 are formed in the first frame body 20 formed from a thin synthetic resin sheet, the length of the vehicle display apparatus 1 in the front-rear direction can be maintained the same even when the upper airflow passages 22 and the side airflow passages 23 are provided.

As illustrated in FIG. 3, the upper airflow passages 22 and the side airflow passages 23 have relatively large widths and, thus, allow air to easily flow therethrough. However, since the thicknesses of the upper airflow passages 22 and the side airflow passages 23 are small (i.e., less than or equal to 0.5 mm), external dirt and dust negligibly enter the space formed between the display panel 10 and the cover plate 40 through the upper airflow passages 22 and the side airflow passages 23.

As illustrated in FIG. 3, the upper airflow passage 22 is bent in each of the first boundary portions 22d formed between the outer communication portion 22a and each of the two intermediate communication portions 22c. In addition, the upper airflow passage 22 is bent in each of the second boundary portions 22e located between one of the intermediate communication portions 22c and one of the inner communication portions 22b. Accordingly, even when fine dirt and dust enter the outer communication portion 22a from the outside, the dirt and dust are blocked by the boundary portion 22d and the boundary portions 22e. Thus, the dirt and dust negligibly enter the space formed between the display panel 10 and the cover plate 40.

As illustrated in FIG. 3, the side airflow passage 23 is also bent in the boundary portion 23c located between the outer communication portion 23a and the inner communication portion 23b. Accordingly, entry of dirt and dust into the space formed between the display panel 10 and the cover plate 40 can be easily prevented.

As illustrated in FIGS. 4 and 5, when an occupant of the motor vehicle looks at the vehicle display apparatus 1, the field of view Va of the display screen in the up-down direction is defined by the distance between the upper edge portion 4a and the lower edge portion 4b of the panel window 4, and the field of view Vb in the right-left direction is defined by the distance between the right edge portion 4c and the left edge portion 4d of the panel window 4.

The four edge portions 4a, 4b, 4c, and 4d of the panel window 4 are located inwardly from the edge portions 21a, 21b, 21c, and 21d of the first window 21 of the first frame body 20. The edge portions 33a, 33b, 33c, and 33d of the second window 33 formed in the second frame body 31 are located farther from the display screen 12a than the edge portions 21a, 21b, 21c, and 21d of the first window 21. In addition, the edge portions 14a, 14b, 14c, and 14d of the display window 14 formed in the case frame body 13 are located farther from the display screen 12a than the edge portions 21a, 21b, 21c, and 21d of the first window 21. Accordingly, when the panel window 4 is viewed from the front at an angle, only the edge portions 21a, 21b, 21c, and 21*d* of the colored first frame body 20 are visible. The metal case frame body 13 and the second frame body 31 are hardly viewed.

Furthermore, as illustrated in FIG. 3, each of the inner communication portions 22*b* of the upper airflow passage 22 is located above and away from the edge portion 21*a* of the first window 21 in the up-down direction, and the inner communication portions 23*b* of the right and left side airflow passages 23 are located laterally away from the right edge portion 21*c* and left edge portion 21*d*, respectively. Accordingly, when the display screen 12*a* is viewed through the panel window 4, it is unlikely that the inner communication portions 22*b* and the inner communication portion 23*b* are viewed.

The vehicle display apparatus 1 has the above-described upper airflow passages 22 and side airflow passages 23 formed in the first frame body 20, and the first frame body 20 is formed from a synthetic resin sheet that defines the display area (the display range) of the display screen 12*a*. Accordingly, an additional component for forming an airflow passage is not required. As a result, even when an airflow passage is formed, the length of the vehicle display apparatus 1 in the front-rear direction can be reduced.

Figure 8A:
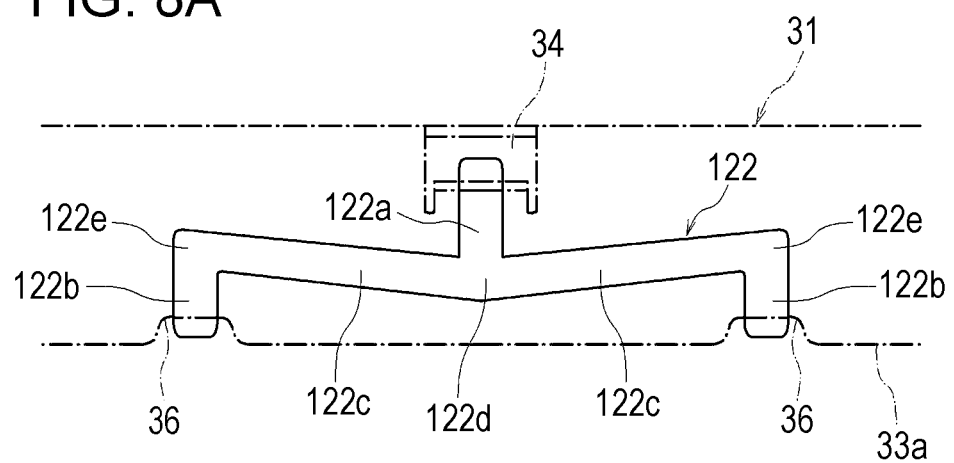
FIGS. 8A and 8B illustrate a modification of the shape of an airflow passage.

A modification of the shape of the airflow passage is described next with reference to FIGS. 8A and 8B. As illustrated in FIG. 8A, an upper airflow passage 122 has an outer communication portion 122*a*, two inner communication portions 122*b*, and two intermediate communication portions 122*c*. A first boundary portion 122*d* is formed between the outer communication portion 122*a* and each of the two intermediate communication portions 122*c*. A second boundary portion 122*e* is formed between each of the two intermediate communication portions 122*c* and one of the two inner communication portions 122*b*. The upper airflow passage 122 is disposed at a position at which the second boundary portion 122*e* is positioned farther from the upper edge portion 33*a* of the second window 33 than the first boundary portion 122*d*. Accordingly, each of the two intermediate communication portions 122*c* extends at an angle from the upper edge portion 33*a*.

According to the above-described structure, even when dirt and dust enter the outer communication portion 122*a*, it is difficult for the dirt and dust to travel to the second boundary portion 122*e* located at a higher position. Thus, it is difficult for the dirt and dust to reach each of the inner communication portions 122*b*.

Figure 8B:
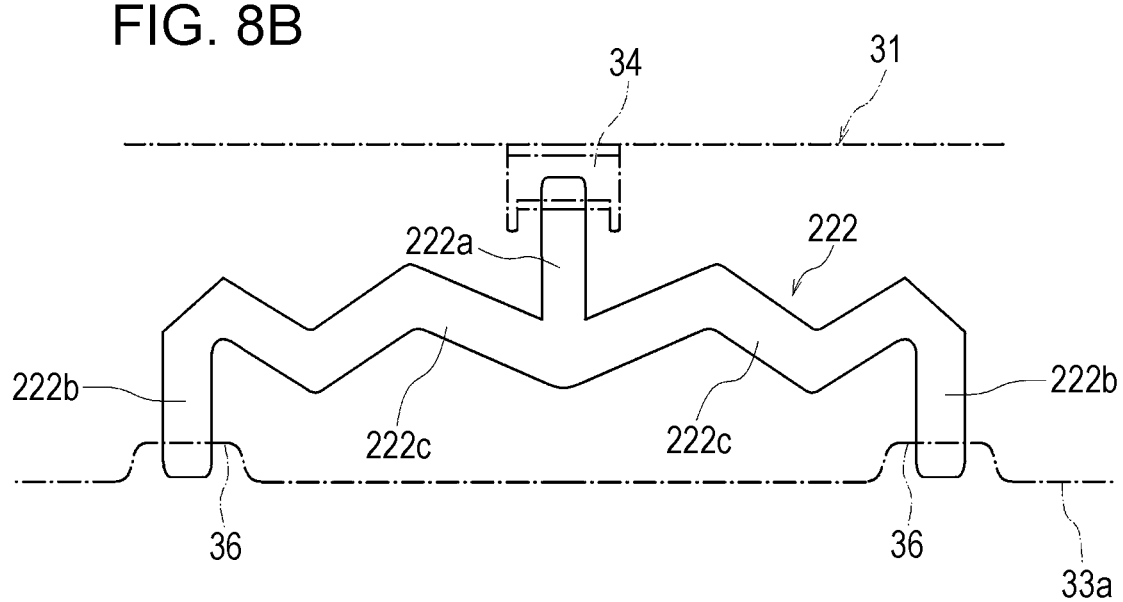

As illustrated in FIG. 8B, an upper airflow passage 222 has an outer communication portion 222*a*, two inner communication portions 222*b*, and two intermediate communication portions 222*c*. Each of the two intermediate communication portions 222*c* has a plurality of bent portions.

Therefore, even when dirt and dust enter the outer communication portion 222*a*, it is difficult for the dirt and dust to reach each of the inner communication portions 222*b*.

It is intended that the foregoing detailed description be regarded as illustrative rather than limiting, and that it be understood that it is the following claims, including all equivalents, that are intended to define the spirit and scope of this invention.

What is claimed is:

1. A display apparatus comprising:
a display panel;
a first frame body disposed in front of the display panel;
a second frame body disposed in front of the first frame body; and
a cover plate that is a glass plate or a transparent synthetic resin sheet disposed in front of the second frame body,
wherein a first window formed in the first frame body and a second window formed in the second frame body are located in front of a display screen of the display panel, and
wherein an airflow passage is formed in the first frame body so as to pass through the first frame body, at least part of an outer communication portion of the airflow passage is positioned so as not to occupy the same space as the second frame body, and at least one inner communication portion of the airflow passage communicates with a space formed between the display panel and the cover plate;
wherein the airflow passage has a bent portion between the outer communication portion and the inner communication portion, the airflow passage has an intermediate communication portion between the outer communication portion and the inner communication portion, a bent portion is formed in a first boundary portion formed between the outer communication portion and the intermediate communication portion, and a bent portion is formed in a second boundary portion formed between the inner communication portion and the intermediate communication portion.

2. The display apparatus of claim 1, wherein the display panel has a metal case frame body attached thereto, the case frame body has a display window configured to allow a display screen to be exposed therethrough, and an edge portion of the first window is located closer to the center of the display screen than an edge portion of the display window.

3. The display apparatus of claim 1, wherein the first frame body is formed from a colored synthetic resin sheet.

4. The display apparatus of claim 1, wherein an edge portion of the first window is located closer to the center of the display screen than an edge portion of the second window.

5. The display apparatus of claim 1, wherein the inner communication portion is formed at a position away from an edge portion of the first window.

6. The display apparatus of claim 1, wherein the second frame body has one of a hole and a notch formed therein, the one of the hole and the notch configured to allow the outer communication portion of the airflow passage to be exposed thereinside, and the airflow passage communicates with a space immediately in front of the second frame body.

7. The display apparatus of claim 1, wherein the inner communication portion is formed so as to protrude from an edge portion of the second window.

8. The display apparatus of claim 7, wherein the edge portion of the second window has a concave portion that allows the inner communication portion to be exposed thereinside.

9. The display apparatus of claim 1, wherein the second boundary portion is disposed farther from the display screen than the first boundary portion.

10. The display apparatus of claim 1, wherein a bent portion is formed in the middle of the intermediate communication portion.

11. The display apparatus of claim 1, wherein the airflow passage has the outer communication portion and a plurality of the inner communication portions.

12. The display apparatus of claim 1, wherein the airflow passage has a bent portion in a boundary portion between the outer communication portion and the inner communication portion.

13. The display apparatus of claim 1, wherein an exterior panel is disposed in front of the cover plate, and an edge portion of a panel window formed in the exterior panel is located closer to the center of the display screen than an edge portion of the first window.

14. The display apparatus of claim 1, wherein the cover plate has a touch sensor mounted thereon.

* * * * *